United States Patent
Yang

(10) Patent No.: US 9,427,735 B2
(45) Date of Patent: Aug. 30, 2016

(54) WELDING METHOD FOR SUBSTRATE AND MEMBRANE OF MEMBRANE MOBILE POLYMER MICROFLUIDIC CHIP

(75) Inventor: Qi Yang, Beijing (CN)

(73) Assignee: Beijing Bohui Innovation Technology Co., Ltd., Beijing (CN)

( * ) Notice: Subject to any disclaimer, the term of this patent is extended or adjusted under 35 U.S.C. 154(b) by 251 days.

(21) Appl. No.: 14/238,848

(22) PCT Filed: Feb. 29, 2012

(86) PCT No.: PCT/CN2012/071781
§ 371 (c)(1),
(2), (4) Date: Feb. 14, 2014

(87) PCT Pub. No.: WO2013/023449
PCT Pub. Date: Feb. 21, 2013

(65) Prior Publication Data
US 2014/0216647 A1    Aug. 7, 2014

(30) Foreign Application Priority Data

Aug. 16, 2011 (CN) .......................... 2011 1 0235234

(51) Int. Cl.
*B29C 65/16* (2006.01)
*B01L 3/00* (2006.01)
(Continued)

(52) U.S. Cl.
CPC .......... *B01L 3/502707* (2013.01); *B29C 65/16* (2013.01); *B29C 65/1635* (2013.01); *B29C 65/1696* (2013.01); *B29C 66/242* (2013.01); *B29C 66/244* (2013.01); *B29C 66/344* (2013.01); *B29C 66/53461* (2013.01);
(Continued)

(58) Field of Classification Search
CPC .......... B29C 65/1635; B29C 65/1696; B29C 65/16; B29C 66/8266; B29C 66/82661; B29C 66/242; B29C 66/244; B29C 66/344; B29C 66/53461; B29C 66/81267; B29C 66/81455; B29C 66/9221; B29C 66/9241; B29C 66/961; B01L 3/502707; B81C 3/001
See application file for complete search history.

(56) References Cited

U.S. PATENT DOCUMENTS 4,953,287 A * 9/1990 West ...................... B29C 65/30
156/285
5,094,709 A * 3/1992 Eichelberger ........... H01L 21/56
156/380.9
(Continued)

FOREIGN PATENT DOCUMENTS

| CN | 1266776 | 9/2000 |
|---|---|---|
| CN | 1496778 | 5/2004 |
| CN | 101026101 | 8/2007 |

*Primary Examiner* — Daniel McNally
(74) *Attorney, Agent, or Firm* — Eagle IP Limited; Jacqueline C. Lui

(57) ABSTRACT

The present invention discloses a welding method for substrate and membrane of membrane mobile polymer microfluidic chip, which relates to the manufacturing technology of membrane mobile polymer microfluidic chip and comprises the following steps: before the welding, the substrate is fixed, the surface of the substrate is covered with the membrane; the membrane is pressed against the surface of the substrate, and in the course of welding, the laser irradiates the welding area on the substrate through the membrane, and the welding area fuses and then welds the substrate and membrane together. The present invention realizes the firm welding between membrane and substrate of membrane mobile polymer microfluidic chip, and ensures that the weld face is flat and uniform.

19 Claims, 4 Drawing Sheets

(51) Int. Cl.
*B29C 65/00* (2006.01)
*B81C 3/00* (2006.01)
*B29L 31/00* (2006.01)

(52) U.S. Cl.
CPC ... *B29C66/81267* (2013.01); *B29C 66/81455* (2013.01); *B29C 66/8266* (2013.01); *B29C 66/82661* (2013.01); *B29C 66/9221* (2013.01); *B29C 66/9241* (2013.01); *B29C 66/961* (2013.01); *B81C 3/001* (2013.01); *B01L 2200/0689* (2013.01); *B01L 2300/044* (2013.01); *B01L 2300/0816* (2013.01); *B29C 65/1654* (2013.01); *B29C 66/7392* (2013.01); *B29C 66/82421* (2013.01); *B29C 66/82423* (2013.01); *B29C 66/8322* (2013.01); *B29C 66/919* (2013.01); *B29C 66/9161* (2013.01); *B29C 66/934* (2013.01); *B29C 66/939* (2013.01); *B29L 2031/756* (2013.01); *B81B 2201/058* (2013.01); *B81B 2203/0127* (2013.01); *B81C 2203/036* (2013.01)

(56) References Cited

U.S. PATENT DOCUMENTS

| | | | |
|---|---|---|---|
| 6,092,578 A * | 7/2000 | Machida | B29C 43/56 156/358 |
| 2002/0088777 A1* | 7/2002 | Grewell | B29C 65/1435 219/121.63 |
| 2007/0125489 A1* | 6/2007 | Paul | B29C 66/73921 156/272.8 |
| 2007/0196588 A1* | 8/2007 | Shinjo | B32B 37/04 427/457 |
| 2010/0236705 A1* | 9/2010 | Chou | B01L 3/502707 156/273.7 |

* cited by examiner

WELDING METHOD FOR SUBSTRATE AND MEMBRANE OF MEMBRANE MOBILE POLYMER MICROFLUIDIC CHIP This application is a continuation under 35 U.S.C. Sections 365(c) and 120 of International Application No. PCT/CN2012/071781, filed Feb. 29, 2012 and published on Feb. 21, 2013 as WO 2013/023449, which claims priority from Chinese Patent Application No. 201110235234.0 filed Aug. 16, 2011, which are incorporated herein by reference in their entirety.

TECHNICAL FIELD

The present invention relates to the manufacturing technology for membrane mobile polymer microfluidic chip, and especially relates to a welding method for substrate and membrane of membrane mobile polymer microfluidic chip.

BACKGROUND

The manufacturing methods and apparatuses for membrane mobile polymer microfluidic chip are the key for microfluidics technology to realize industrial production and enter into application market. By using the laser radiation fusion welding method to weld polymer, the precision and quality of welding can be improved and the micro-welding processing can be carried out.

The Chinese invention patent ZL00101924.4 "Laser welding method and apparatus for welding plastic workpieces or welding plastics and other materials" discloses a method for using laser to weld plastic workpieces; whereby the two workpieces to be welded are pressed together, the weld faces thereof contact with each other, the workpiece close to laser is transparent to the laser, the other workpiece is not transparent and used to absorb the heat generated by the laser, and the welding is realized through application of laser; the Chinese invention patent ZL 03132664.1 "Method and apparatus used to process workpieces" discloses a fixing method and apparatus for using laser to weld and process workpieces; wherein the apparatus is composed of upper clamping component and lower clamping component, the upper clamping component mainly consists a transparent upper clamping plate and a transparent elastic membrane; the lower clamping component consists a lower clamping plate, a pressure chamber and a pressure piston; the welding laser is eradiated from above, and the control on welding area is realized through the transparent area and non-transparent area of a mask placed on the transparent upper clamping plate; the weld faces of two workpieces contact with each other under pressure, the upper workpiece which is close to laser source shall be transparent to laser, and the lower workpiece shall be able to absorb the laser as much as possible. This method and apparatus are applicable to the welding of two workpieces which are rigid or elastic materials without considering deformation.

As for the workpieces to be welded in a manufacturing process of membrane mobile polymer microfluidic chip, one is a transparent elastic membrane, and the other is a non-transparent rigid substrate. In the course of welding, two weld faces shall be flat and in contact with each other, and vertical pressure must exist; in practice, the weld face of substrate to be welded is not an ideal plane, but is rugged. A flat plate is adopted as the upper clamping plate, but even under the pressure, there still exist clearance and gas film in the plane, so that the welding can't be realized; a transparent elastic pad is added under the flat plate, so as to make some compensation for planeness. Since the operating principle is based on the elastic deformation of elastic pad under the pressure, the deformation at raised portion of substrate is larger under the action of higher pressure, and the deformation at depressed portion under the action of lower pressure. As a result, after the fusion welding, the welding effect varies in different portions; at depressed portion, the situation that the welding is not firm or no welding is realized may occur; abrupt change exists at the edge of groove on substrate, the membrane is not supported, and the pressure generates a tensile force to the membrane and directly affects the flatness of membrane after welding; as for a precision membrane welding such as microfluidics, the welding is not qualified; if the transparent elastic pad is thickened and hardened, it can ensure the relatively large elastic deformation and avoid the excessive deformation at the structure such as groove, but the thickened transparent pad may absorb the laser and thus affect the welding.

Therefore, the existing technologies can't realize a firm welding between substrate and membrane of microfluidic chip.

SUMMARY

Technical Problem to be Solved

The technical problem to be settled by the present invention is: how to realize the firm welding between substrate and membrane of membrane mobile polymer microfluidic chip and ensure that the weld face is flat and uniform.

Technical Solutions

In order to solve the above-mentioned technical problem, the present invention provides a welding method for a substrate and a membrane of a membrane mobile polymer microfluidic chip, comprising: before the welding, the substrate is fixed, and the surface of the substrate is covered with the membrane; the membrane is pressed against the surface of the substrate by applying pressure, and in the course of welding, the laser irradiates the welding area on the substrate through the membrane, and the welding area fuses and then the substrate and the membrane are welded together.

Wherein, a pulling force is applied to the membrane so as to tense the membrane up, and then the membrane is used to cover the surface of the substrate.

Wherein, the value of the pulling force is adjusted according to the elastic parameter of the membrane and the value of pressure applied in the course of application of pressure.

Wherein, a mask is adopted to shield the non-welding area of the substrate before the welding, so as to ensure that the laser will irradiate the welding area of the substrate through the transparent area of mask.

Wherein, a pressure is applied by using the transparent clamping plate, so as to press the membrane against the surface of the substrate.

Wherein, a layer of transparent elastic pad is arranged between the membrane and the clamping plate before the pressure is applied by using the transparent clamping plate.

Wherein, the stratochamber is used to apply pressure, so as to press the membrane against the surface of the substrate; or the air pressure of the stratochamber and the outside air pressure are applied onto the weld faces of the membrane and substrate simultaneously; and wherein the stratochamber is in the closed state when the air pressure is applied.

Wherein, the stratochamber is located on the same side as the membrane, and the membrane is used to seal up the stratochamber; air is filled into the stratochamber, the filled air forms an air pressure face on the surface of the membrane, so as to apply pressure onto the membrane, and the body of the first stratochamber is made of transparent material.

Wherein, the filling of air also includes a step of adjusting the air pressure in the stratochamber.

Wherein, the stratochamber is located on the same side as the membrane, the surface of the membrane is covered with a layer of clamping film, and the clamping film is used to seal up the stratochamber; air is filled into the stratochamber, the filled air forms an air pressure face on the surface of the membrane, so as to apply pressure onto the membrane, and the body of the first stratochamber is made of transparent material.

Wherein, a pulling force is applied to the clamping film after the surface of the membrane is covered with the clamping film, and the value of the pulling force is adjusted on the basis of the value of air pressure in the course of filing of air.

Wherein, the material features of the clamping film are the same as those of the membrane.

Wherein, the filling of air also includes a step of adjusting the air pressure in the stratochamber.

Wherein, the stratochamber is located on the same side as the substrate, and the membrane is used to seal up the stratochamber; the air in stratochamber is extracted, and the outside air pressure forms an air pressure face on the surface of the membrane, so as to apply pressure onto the membrane.

Wherein, the extraction of air also includes a step of adjusting the air pressure in the stratochamber.

Wherein, two stratochambers are involved, the first stratochamber is located on the membrane side, the second stratochamber is located on the substrate side, and the membrane is used to seal up the first stratochamber and the second stratochamber; air is filled into the first stratochamber, and at the same time the air in the second stratochamber is extracted, and the air pressure difference between the two stratochambers forms an air pressure face on the surface of the membrane, so as to apply pressure onto the membrane, and the body of the first stratochamber is made of transparent material.

Wherein, the filling and extraction of air also include a step of adjusting the air pressure in the first stratochamber and the second stratochamber.

Wherein, two stratochambers are involved, the first stratochamber is located on the membrane side, the second stratochamber is located on the substrate side, the surface of the membrane is covered with a layer of clamping film, the clamping film is used to seal up the first stratochamber, and the membrane is used to seal up the second stratochamber; air is filled into the first stratochamber, and at the same time the air in the second stratochamber is extracted; the air pressure face formed on surface of clamping film by the air pressure of the first stratochamber and the air pressure face formed on the surface of the membrane by outside air pressure jointly apply pressure onto the membrane, and the body of the first stratochamber is made of transparent material.

Wherein, a pulling force is applied to the clamping film after the surface of the membrane is covered with the clamping film, and the value of the pulling force is adjusted on the basis of the value of air pressure in the course of filling of air.

Wherein, the material features of the clamping film are the same as those of the membrane.

Wherein, the filling and extraction of air also include a step of adjusting the air pressure in the first stratochamber and second stratochamber.

Beneficial Effects

In the present invention, the welding is carried out after the membrane is tensed up under the action of pressure, so as to ensure that the substrate and membrane of membrane mobile polymer microfluidic chip are welded firmly, the membrane is not damaged and the weld face is flat and uniform; as driven by the air pressure, the welded moving parts and valves can normally operate for more than 5,000 times. Please refer to Table 1 "Date Sheet of Fatigue Testing for Laser-welded Membrane".

The pulling force may be adjusted on the basis of the elastic parameters of membrane and the pressure of pressure-applying apparatus, so as to make the membrane flat, control the tensile deformation and ensure the quality of welding.

As for the pressure-applying mode based on stratochamber—clamping film, the clamping film may be selected on the basis of the membrane parameters and the deformation of weld face under pressure may be controlled by adjust the pulling force of clamping film and the pressure in stratochamber, so as to control weld quality. The structure of stratochamber is relatively independent and easy to control.

As for the pressure-applying mode whereby the air is extracted from stratochamber, some elements in light path are omitted, so as to enable the light path to realize the high-precision welding, reduce the loss in light path and simplify the structure.

SPECIFIC DESCRIPTION OF EMBODIMENTS

Through the combination of the figures and the embodiments, the specific embodiments of the present invention are further described in details. The following embodiments are used to explain the present invention, rather than limit the scope of the present invention.

Embodiment 1

Figure 1:
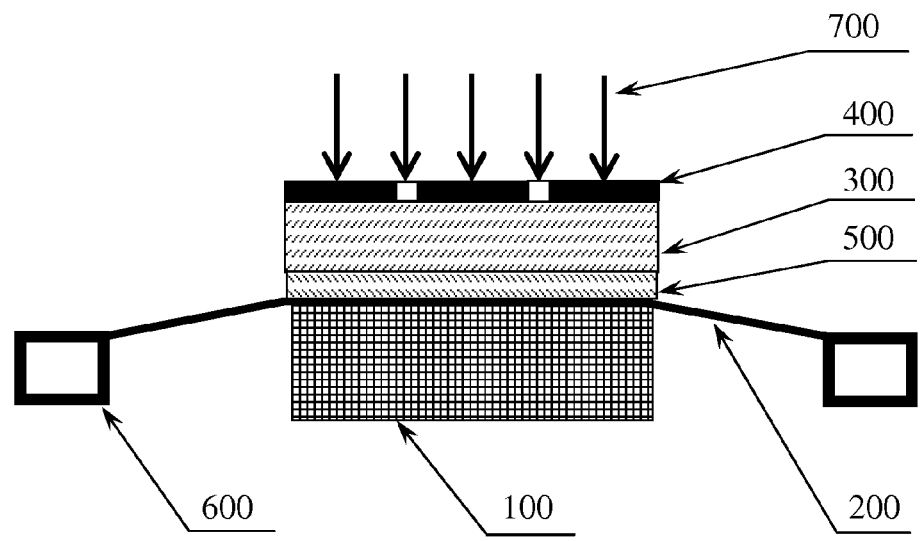
FIG. 1 is a schematic diagram for the structure welded by using a welding method for substrate and membrane of membrane mobile polymer microfluidic chip according to Embodiment 1 of the present invention.

The present embodiment provides a welding method for substrate and membrane of membrane mobile polymer microfluidic chip, and the schematic diagram for structure welded by using the welding method described in the present embodiment is as indicated in FIG. 1. Before the welding, the substrate (100) is fixed, the surface of substrate (100) is covered with the membrane (200), the membrane (200) is pressed against the surface of substrate (100); and in the present embodiment, a transparent clamping plate (300) is used to apply pressure onto the membrane.

Preferably, in order to realize the firm welding, a certain pulling force is applied onto the membrane (200) by tensing up the apparatus (600), and the surface of substrate (100) is covered with the tensed membrane (200). In the course of application of pressure, the value of pulling force is adjusted on the basis of the elastic parameters of membrane (200) and the value of pressure applied. Since the membrane (200) is tensed up, the substrate (100) supports the membrane (200) from below, so that the membrane (200) is attached to the surface of substrate (100), the tensile deformation is controlled and the quality of welding is ensured.

In practice, the weld face of substrate (100) to be welded is not an ideal plane, but is rugged. A flat plate is adopted as clamping plate (300), but even under the pressure, there still exist clearance and gas film in the plane, so that the firm welding can't be realized. Preferably, before the pressure is applied, a layer of transparent elastic pad (500) is placed on the surface of membrane (200), so as to make certain compensation for the problem caused by unflatness and make the welding firmer without damage to the membrane (200).

Since normally only the specific welding area is welded, a mask (400) is placed in the light path of laser (700) before the welding. In details, the mask (400) may be placed on the surface of membrane (200) before the elastic pad (500) is placed, or the mask (400) may be placed on elastic pad (500) and then the clamping plate (300) is placed after the elastic pad (500) is placed, or the mask (400) may be placed on clamping plate (300) after the clamping plate (300) is placed. In the present embodiment, the mask (400) is placed on the clamping plate (300). The transparent area on the mask (400) is corresponding to the welding area on substrate (100). In the course of welding, the laser (700) irradiates the welding area on substrate (100) through the transparent area, the welding area fuses under heat and bonds substrate (100) and membrane (200) together when hardening, so as to complete the welding.

As for the welding method in the present embodiment, the membrane (200) is tensed up and covers the substrate (200), so as to ensure that the substrate (100) and membrane (200) are firmly welded and the weld faces are flat and uniform; in addition, the structure adopted to implement the method is simple and the operation is easy.

Embodiment 2

Figure 2:
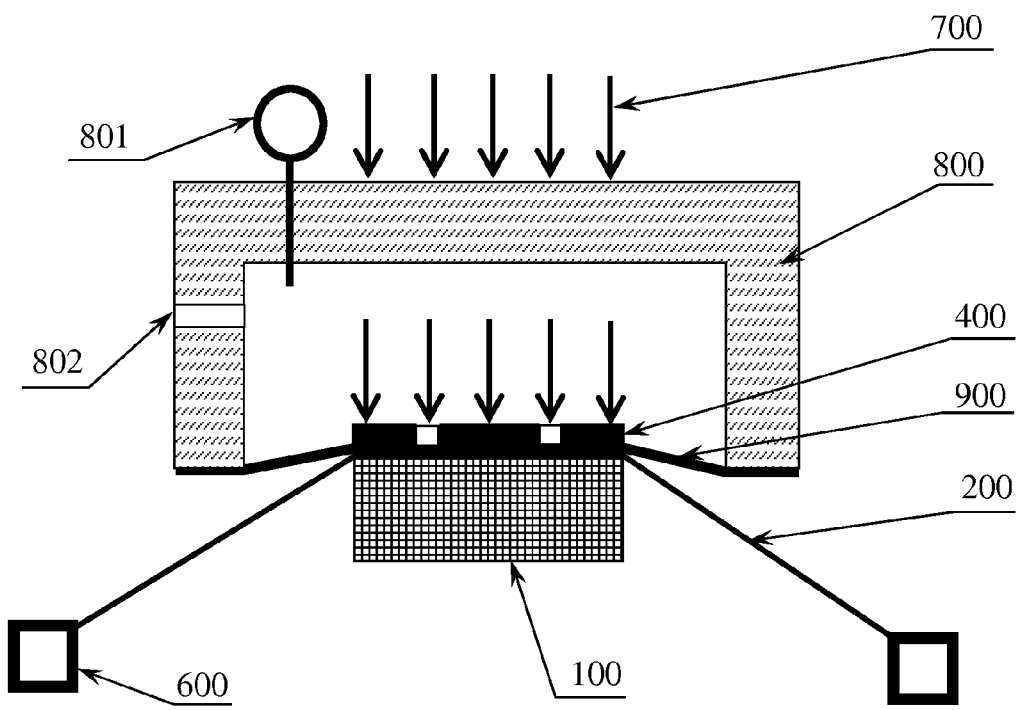
FIG. 2 is a schematic diagram for the structure welded by using a welding method for substrate and membrane of membrane mobile polymer microfluidic chip according to Embodiment 2 of the present invention.

The present embodiment provides a welding method for substrate and membrane of membrane mobile polymer microfluidic chip, and the schematic diagram for structure welded by using the welding method described in the present embodiment is as indicated in FIG. 2. The welding steps are basically as same as those in Embodiment 1, and the only difference is the mode for applying pressure onto membrane (100). In the present embodiment, the air pressure-clamping film mode is adopted to apply pressure onto membrane (100). Before the welding, the substrate (100) is fixed, and the surface of substrate (100) is covered with the membrane (200). Preferably, the tensing apparatus (600) is used to tense up the membrane (200), and the surface of substrate (100) is covered with the tensed membrane (200). The stratochamber (800) and clamping film (900) are placed on the surface of membrane (200), the stratochamber (800) is sealed up by clamping film (900) in advance, and the stratochamber (800) is equipped with pressure sensor (801) and control valve (802). When the pressure is being applied, the air is filled into the stratochamber (800) via the control valve (802), and the air pressure forms an air pressure face on the surface of membrane (200), so as to apply pressure onto the membrane (200).

Preferably, the air pressure in the stratochamber (800) is adjusted on the basis of the feedback from pressure sensor (801), so as to ensure that the air pressure reaches the desired value. The clamping film (900) may be made of the material of which the features are as same as those of membrane (200). The deformation of surface of clamping film (900) under a certain welding pressure as the surface of substrate (100) deforms is controlled by applying pressure to clamping film (900) and adjusting the tension of the clamping film (900) and air pressure, so as to control the deformation of membrane (200) in the course of welding, rather than strictly control the tension of membrane (200).

Since poor air tightness may occur to stratochamber (800), the control valve (802) is opened intermittently on the basis of the feedback from pressure sensor (801) for adjusting the value of air pressure in stratochamber (800), so as to achieve the desired pressure. After the adjustment is completed, the control valve (802) is closed, so as to keep the pressure in stratochamber (800) constant.

Before the welding, the mask (400) is placed in the light patch of laser (700), as indicated in FIG. 2. The mask (400) is be placed on clamping film (900) in advance, and then the clamping film (900) is used to seal up the stratochamber (800); or before the irradiation of laser (700), the mask (400) is be placed on stratochamber (800), and the transparent area on mask (400) is corresponding to the welding area on substrate (100). In the course of welding, the laser (700) irradiates the welding area on substrate (100) through the transparent area, and the welding area fuses under the action of heat and bonds substrate (100) and membrane (200) together when hardening, so as to complete the welding.

In order to ensure that the laser irradiates the welding area on substrate (100), both the stratochamber (800) and clamping film (900) in the present embodiment are made of transparent materials.

In the present embodiment, the air pressure-clamping film mode is adopted to apply pressure, and the air pressure face and clamping film jointly ensure that the membrane (200) is attached to the surface of substrate (100), so that the welding is firm and the weld face is flat and uniform.

Embodiment 3

Figure 3:
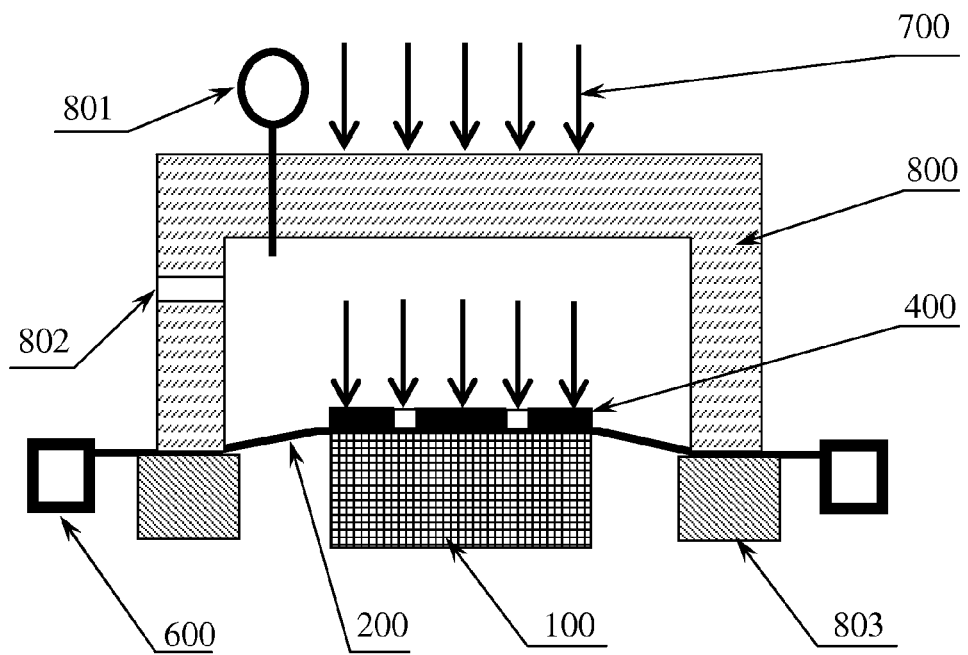
FIG. 3 is a schematic diagram for the structure welded by using a welding method for substrate and membrane of membrane mobile polymer microfluidic chip according to Embodiment 3 of the present invention.

As indicated in FIG. 3, the welding method for substrate and membrane of membrane mobile polymer microfluidic chip in the present embodiment is substantially same as that in Embodiment 2, and the only difference is that no clamping film is adopted to seal up the stratochamber (800), and instead, after the substrate (100) and membrane (200) are properly placed, the membrane (200) is firmly pressed against the stratochamber (800) by using the sealing seat (803) of stratochamber (800), so as to seal up the stratochamber (800). Preferably, before the sealing, the tensing apparatus (600) is used to apply a pulling force to the membrane (200), so as to tense it up. The pressure-applying mode is as same as that in Embodiment 2.

Preferably, when the air is being filled, the value of pulling force is adjusted on the basis of the elastic parameters of membrane (200) and the value of air pressure, so as to control the tensile deformation and ensure the welding quality. In the present embodiment, since the stratochamber (800) is sealed up by the membrane (200), the adjustment of pulling force of membrane (200) may lead to the poor air tightness of stratochamber (800). Therefore, the control valve (802) is opened intermittently for adjusting the air pressure in stratochamber (800) on the basis of the feedback from pressure sensor (801), so as to achieve the desired pressure. After the adjustment is completed, the control valve (802) is closed, so as to keep the pressure in stratochamber (800) constant.

Before the welding, the mask (400) is placed in the light path of the laser (700), as indicated in FIG. 3. The mask (400) is be placed on membrane (200) in advance, and then the membrane (200) is used to seal up the stratochamber (800); or before the irradiation of laser (700), the mask (400) is be placed on stratochamber (800), and the transparent area on mask (400) is corresponding to the welding area on substrate (100). In the course of welding, the laser (700) irradiates the welding area on substrate (100) through the transparent area, and the welding area fuses under the action of heat and bonds substrate (100) and membrane (200) together when hardening, so as to complete the welding. In the present embodiment, the stratochamber (800) is made of transparent material.

As compared with Embodiment 2, the clamping film (900) is omitted in the present embodiment, so as to reduce the energy loss of laser (700) in light path, improve the accuracy and efficiency of welding, realize the firm welding, and ensure that the weld face is flat and uniform.

Embodiment 4

Figure 4:
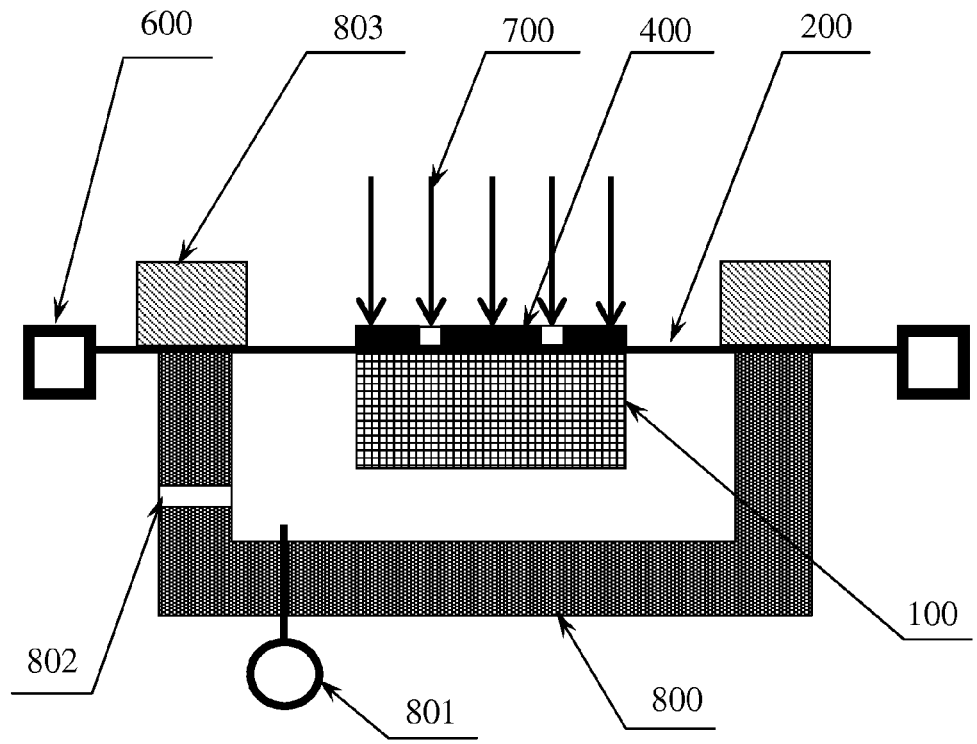
FIG. 4 is a schematic diagram for the structure welded by using a welding method for substrate and membrane of membrane mobile polymer microfluidic chip according to Embodiment 4 of the present invention.

The present embodiment provides a welding method for substrate and membrane of membrane mobile polymer microfluidic chip, as indicated in FIG. 4. As compared with the Embodiment 3, the present embodiment adopts a different pressure-applying mode, whereby the stratochamber (800) and substrate (100) are on the same side, and the pressure is applied through air extraction. It is detailed as follows:

Before the welding, the substrate (100) is fixed, and the surface of substrate (100) is covered with the membrane (200). Preferably, the tensing apparatus (600) is used to tense up the membrane (200), and then the surface of substrate (100) is covered with the tensed membrane (200). The stratochamber (800) is placed on the same side of the substrate (100), and the membrane (200) is firmly pressed against the stratochamber (800) by using the sealing seat (803) of stratochamber (800), so as to seal up the stratochamber (800). When the pressure of being applied, the air in stratochamber (800) is extracted through control valve (802), and the air pressure in stratochamber (800) may be measured by the pressure sensor (801). After the air is extracted, the outside air pressure forms an air pressure face on the surface of membrane (200), so as to apply the pressure, which means that the outside air pressure presses the membrane (200) downwards. Since the stratochamber (800) is sealed up by the membrane (200), the portion of membrane (200) which does not contact with the surface of substrate (100) is pressed by the outside air pressure, so that the membrane (200) is closely attached to the surface of substrate (100).

Preferably, in the course of air extraction, the value of pulling force is adjusted on the basis of the elastic parameters of membrane (200) and the value of air pressure, so as to control the tensile deformation and ensure the welding quality. In the present embodiment, since the stratochamber (800) is sealed up by the membrane (200), the adjustment of pulling force of membrane (200) may lead to the poor air tightness of stratochamber (800). Therefore, the control valve (802) is opened intermittently for adjusting the air pressure in stratochamber (800) on the basis of the feedback from pressure sensor (801), so as to achieve the desired pressure. After the adjustment is completed, the control valve (802) is closed, so as to keep the pressure in stratochamber (800) constant.

Before the welding, the mask (400) is placed in the light path of the laser (700), as indicated in FIG. 4. Before the irradiation of laser (700), the mask (400) is placed on membrane (200) and the transparent area on mask (400) is corresponding to the welding area on substrate (100). In the course of welding, the laser (700) irradiates the welding area on substrate (100) through the transparent area, the welding area fuses under the action of heat and bonds substrate (100) and membrane (200) together when hardening, so as to complete the welding.

As compared with the Embodiments 2 and 3, there is only the mask (400) in the light path in the present embodiment, which enables the light path to achieve the high-precision welding, reduces the energy loss in light path, simplifies the structure, realizes the firm welding and ensures the flat and uniform weld face.

Embodiment 5

Figure 5:
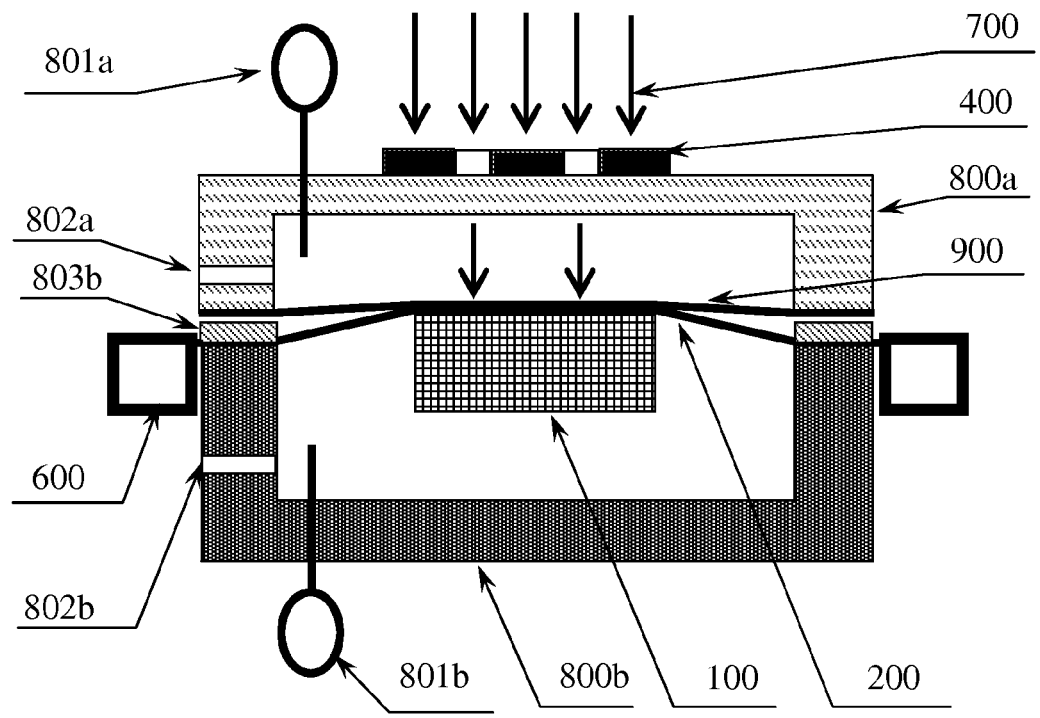
FIG. 5 is a schematic diagram for the structure welded by using a welding method for substrate and membrane of membrane mobile polymer microfluidic chip according to Embodiment 5 of the present invention.

The present embodiment provides a welding method for substrate and membrane of membrane mobile polymer microfluidic chip, the welding process is substantially same as that in the Embodiments 2, 3 and 4, and the difference is that a pressure-applying mode based on two stratochamber is adopted, as indicated in FIG. 5. The first stratochamber (800a) and membrane (200) are on the same side, the second stratochamber (800b) and substrate (100) on the same side. It is detailed as follows:

Before the welding, the substrate (100) is fixed, and the surface of substrate (100) is covered with the membrane (200). Preferably, the tensing apparatus (600) is used to tense up the membrane (200), and then the surface of substrate (100) is covered with the tensed membrane (200). In the present embodiment, the sealing seat (803b) of second stratochamber (800b) is used to press the tensed membrane (200) against the second stratochamber (800b), so as to seal up the second stratochamber (800b). The first stratochamber (800a) and clamping film (900) are placed on the surface of membrane (200), and the first stratochamber (800a) is sealed up by the clamping film (900) in advance. The first stratochamber (800a) is equipped with pressure sensor (801a) and control valve (802a), and the second stratochamber (800b) is equipped with pressure sensor (801b) and control valve (802b). For the purpose of applying the pressure, the air is filled into the first stratochamber (800a) through the control valve (802a), and the air pressure forms an air pressure face on the surface of clamping film (900), so as to apply pressure onto the membrane (200); at the same time, the air is extracted from second stratochamber (800b) through control valve (802b), and an air pressure face on the surface of membrane (200) formed by the outside air pressure and a air pressure face formed by the first stratochamber (800a) apply pressure onto the membrane (200) at the same time.

Preferably, the air pressure in first stratochamber (800a) is adjusted on the basis of the feedback from pressure sensor (801a), and at the same time the air pressure in second stratochamber (800b) is adjusted on the basis of the feedback from pressure sensor (801b), so as to ensure that the total air pressure reaches the desired value.

Preferably, the clamping film (900) may be made of the material of which the features are as same as those of membrane (200). The deformation of surface of clamping film (900) under a certain welding pressure as the surface of substrate (100) deforms is controlled by applying pressure to clamping film (900) and adjusting its tension and air pressure, so as to control the deformation of membrane (200) in the course of welding, rather than strictly control the tension of membrane (200).

Since poor air tightness may occur to first stratochamber (800a) and second stratochamber (800b), the control valve (802) is opened intermittently on the basis of the feedback from pressure sensor (801a) for adjusting the air pressure in first stratochamber (800a), and at the same time the control valve (802) is opened intermittently on the basis of the feedback from pressure sensor (801b) for adjusting the air pressure in second stratochamber (800b), so as to achieve the desired pressure. After the adjustment is completed, the control valve (802) and control valve (802b) are closed, so as to keep the pressure in first stratochamber (800a) and second stratochamber (800b) constant.

Before the welding, the mask 400 is placed in the light path of laser (700), as indicated in FIG. 5. The mask (400) is placed on clamping film (900) in advance, and then the first stratochamber (800a) is sealed up by the clamping film (900); or before the irradiation of laser (700), the mask (400) is placed on first stratochamber (800a) and the transparent area on mask (400) is corresponding to the welding area on substrate (100). In the course of welding, the laser (700) irradiates the welding area on substrate (100) through the transparent area, the welding area fuses under the action of heat and bonds substrate (100) and membrane (200) together when hardening, so as to complete the welding.

In order to enable the laser to irradiate the welding area on substrate (100), both the first stratochamber (800a) and clamping film (900) in the present embodiment are made of transparent materials.

In the present embodiment, the air pressure-clamping film mode is adopted to apply pressure, and the air pressure face and clamping film jointly ensure that the membrane (200) is attached to the surface of substrate (100), so that the welding is firm and the weld face is flat and uniform. Two stratochambers apply the pressure at the same time, so that the relatively high pressure can be obtained.

Embodiment 6

Figure 6:
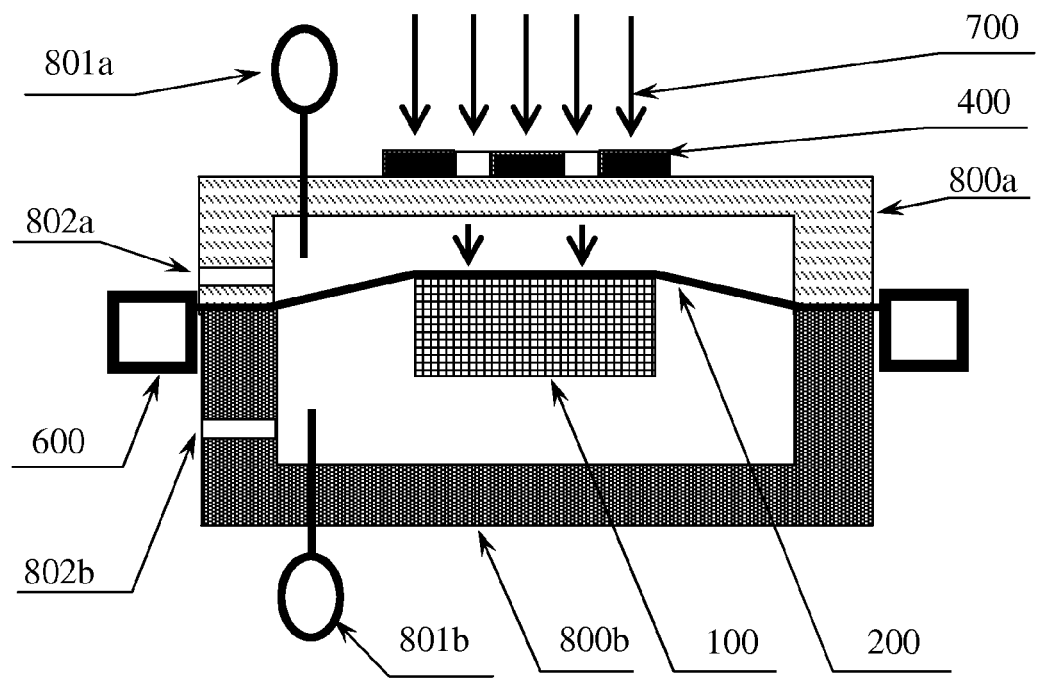
FIG. 6 is a schematic diagram for the structure welded by using a welding method for substrate and membrane of membrane mobile polymer microfluidic chip according to Embodiment 6 of the present invention.

As indicated in FIG. 6, the present embodiment provides a welding method for substrate and membrane of membrane mobile polymer microfluidic chip. As compared with the Embodiment 5, the clamping film (900) is omitted, and the first stratochamber (800a) is also sealed up by the membrane (200). It is detailed as follows:

Before the welding, the substrate (100) is fixed, and the surface of substrate (100) is covered with the membrane (200). Preferably, the tensing apparatus (600) is used to tense up the membrane (200), and the surface of substrate (100) is covered with the tensed membrane (200). In the present embodiment, the first stratochamber (800a) second stratochamber (800b) are sealed up by the tensed membrane (200). The first stratochamber (800a) is equipped with pressure sensor (801a) and control valve (802a), and the second stratochamber (800b) is equipped with pressure sensor (801b) and control valve (802b). For the purpose of applying the pressure, the air is filled into the first stratochamber (800a) through the control valve (802a), and the air pressure forms an air pressure face on the surface of membrane (200), so as to apply pressure onto the membrane (200); at the same time, the air is extracted from second stratochamber (800b) through control valve (802b), and an air pressure face on the surface of membrane (200) formed by the outside air pressure and a air pressure face formed by the first stratochamber (800a) apply pressure onto the membrane (200) at the same time.

Preferably, the air pressure in first stratochamber (800a) is adjusted on the basis of the feedback from pressure sensor (801a), and at the same time the air pressure in second stratochamber (800b) is also adjusted on the basis of the feedback from pressure sensor (801b), so as to ensure that the total air pressure reaches the desired value.

Preferably, in the course of air filling and air extraction, the value of pulling force is adjusted on the basis of the elastic parameters of membrane (200) and the value of air pressure, so as to control the tensile deformation and ensure the welding quality.

Since poor air tightness may occur to first stratochamber (800a) and second stratochamber (800b), the control valve (802) is opened intermittently on the basis of the feedback from pressure sensor (801a) for adjusting the air pressure in first stratochamber (800a), and at the same time the control valve (802) is opened intermittently on the basis of the feedback from pressure sensor (801b) for adjusting the air pressure in second stratochamber (800b), so as to achieve the desired pressure. After the adjustment is completed, the control valve (802) and control valve (802b) are closed, so as to keep the pressure in first stratochamber (800a) and second stratochamber (800b) constant.

Before the welding, the mask (400) is placed in the light path of laser (700), as indicated in FIG. 6. The mask (400) is placed on membrane (200) in advance, or before the irradiation of laser (700), the mask (400) is placed on first stratochamber (800a) and the transparent area on mask (400) is corresponding to the welding area on substrate (100). In the course of welding, the laser (700) irradiates the welding area on substrate (100) through the transparent area, and the welding area fuses under the action of heat and bonds substrate (100) and membrane (200) together when hardening, so as to complete the welding.

In order to enable the laser to irradiate the welding area on substrate (100), the first stratochamber (800) in the present embodiment is made of transparent material.

In the present embodiment, the clamping film is omitted, so as to reduce the energy loss of laser (700) in light path, improve the accuracy and efficiency of welding, realize the firm welding, and ensure that the weld face is flat and uniform.

Figure 7:
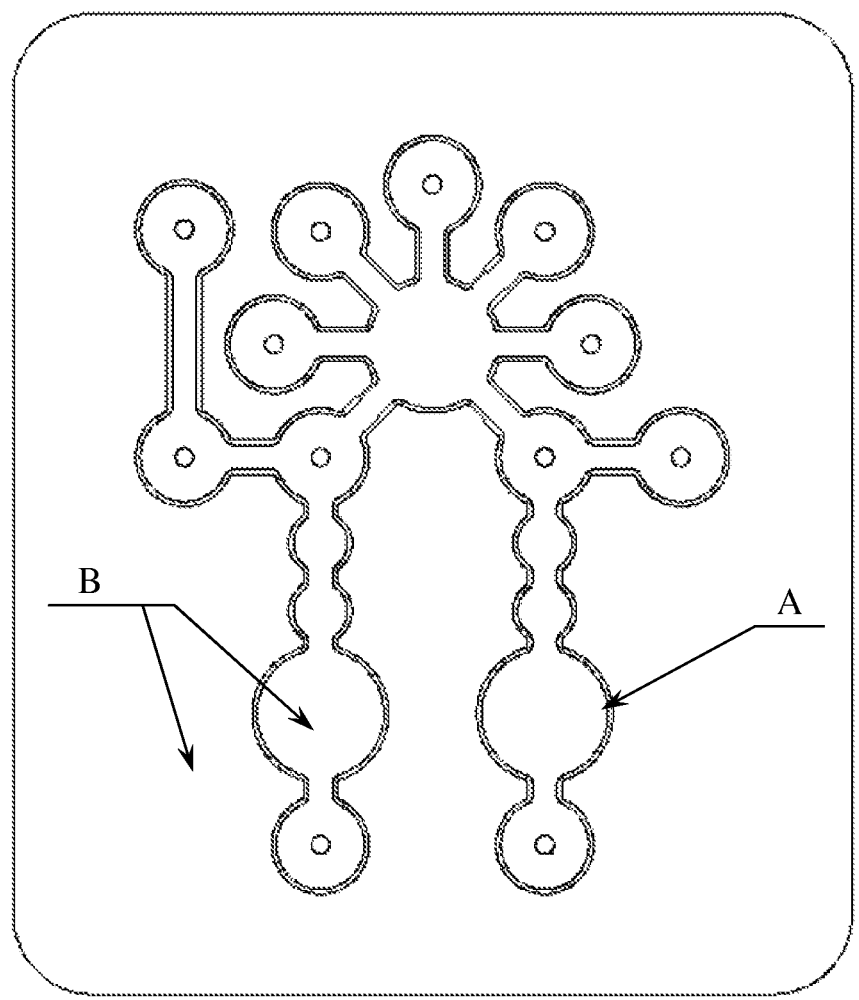
FIG. 7 is a top view after the welding of substrate and membrane of membrane mobile polymer microfluidic chip is completed, namely the outline diagram of welding.

As indicated in FIG. 7, after the welding is carried out by using the welding method as described in the Embodiments 1-6 above, the whole perimeter is the weld face of membrane, the non-transparent area of mask is corresponding to the non-welding area B, and the transparent area of mask is corresponding to the welding area A. The welding area varies according to the functions of membrane mobile polymer microfluidic chip. The fatigue testing for membrane mobile polymer microfluidic chip welded by using the above-mentioned welding mode is listed in the table below, which reveals that, under the condition that the laser power is about 100 W (80-120 W) and the scanning speed is 80 mm/s (60-80 mm/s), the service life of membrane mobile polymer microfluidic chip after the welding is relatively long, reaching more than 6000 times.

TABLE 1

Data Sheet of Fatigue Testing for Laser-welded Membrane

| Chip No. | Power of Laser Welding (W) | Scanning Speed of Laser Welding (mm/s) | Testing Times | Explanation on Breakage |
|---|---|---|---|---|
| 001 | 120 | 60 | 2215 | Breakage of membrane at welded portion |
| 002 | 120 | 80 | 3580 | Breakage of membrane at welded portion |
| 003 | 110 | 60 | 5105 | Breakage of membrane at welded portion |
| 004 | 110 | 80 | 5575 | Breakage of membrane at welded portion |
| 005 | 100 | 60 | 6410 | Sealing off at welded portion |
| 006 | 100 | 80 | 6555 | Breakage of membrane at welded portion |
| 007 | 90 | 60 | 5710 | Sealing off at welded portion |
| 008 | 90 | 80 | 5305 | Sealing off at welded portion |
| 009 | 80 | 60 | 3620 | Sealing off at welded portion |
| 010 | 80 | 80 | 2305 | Sealing off at welded portion |

Other testing conditions:
Membrane strain: $\Delta L/L = 0.12$ mm/150 mm (used to indicate the tension of membrane; $\Delta L$ - single-direction tensile deformation of membrane; L - single-direction length of membrane)
Pressure of clamping film: 6 bar The above embodiments are only used to explain the present invention rather than limit the present invention, and without deviating from the spirit and scope of the present invention, the ordinary technical personnel in the relevant technical field can also make various changes thereof. Therefore, all equivalent technical solutions are also in the scope of the present invention, and the patent protection scope of the present invention shall be limited by the claims.

INDUSTRIAL PRACTICAL APPLICABILITY

In the present invention, the welding is carried out after the membrane is tensed up under the action of pressure, so as to ensure that the substrate and membrane of membrane mobile polymer microfluidic chip are welded firmly, the membrane is not damaged and the weld face is flat and uniform; as driven by the air pressure, the welded moving parts and valves can normally operate for more than 5,000 times. Please refer to Table 1 "Date Sheet of Fatigue Testing for Laser-welded Membrane".

The pulling force may be adjusted on the basis of the elastic parameters of membrane and the pressure of pressure-applying apparatus, so as to make the membrane flat, control the tensile deformation and ensure the quality of welding.

As for the pressure-applying mode based on stratochamber—clamping film, the clamping film may be selected on the basis of the membrane parameters and the deformation of weld face under pressure may be controlled by adjust the pulling force of clamping film and the pressure in stratochamber, so as to control weld quality. The structure of stratochamber is relatively independent and easy to control.

As for the pressure-applying mode whereby the air is extracted from stratochamber, some elements in light path are omitted, so as to enable the light path to realize the high-precision welding, reduce the loss in light path and simplify the structure.

The invention claimed is:

1. A method for welding a substrate and a membrane of a membrane mobile polymer microfluidic chip, comprising:
    fixing the substrate;
    applying, by a fixed tensing apparatus, a pulling force to the membrane;
    covering a surface of the substrate with the membrane;
    pressing the membrane against the surface of the substrate by applying a pressure;
    irradiating, by a laser from a laser source, a welding area on the substrate through the membrane;
    fusing, by the laser, the substrate and the membrane on the welding area;
    wherein the value of the pulling force is adjusted according to elastic parameters of the membrane and the value of the pressure.

2. The method of claim 1, wherein a stratochamber is included to press the membrane against the surface of the substrate.

3. The method of claim 2, wherein the stratochamber is transparent and placed between the laser source and the substrate, and the membrane seals up the stratochamber, wherein the pressure is applied by air filled in the stratochamber that presses the membrane against the surface of the substrate.

4. The method of claim 3, wherein the air filled in the stratochamber is adjusted by a control valve until a pre-determined value of air pressure is reached.

5. The method of claim 2, wherein the stratochamber is transparent and placed between the laser source and the substrate, and the membrane is covered with a clamping film that seals up the stratochamber, wherein the pressure is applied by air filled in the stratochamber that presses the membrane against the surface of the substrate.

6. The method of claim 5, wherein a pulling force is applied to the clamping film after the membrane is covered with the clamping film, and a value of the pulling force is adjusted based on the value of air pressure.

7. The method of claim 2, wherein the stratochamber is encloses the substrate, and the membrane seals up the stratochamber; air in the stratochamber is extracted, and the pressure is applied by outside air that presses the membrane against the surface of the substrate.

8. The method of claim 7, wherein the air extracted in the stratochamber is adjusted by a control valve until a pre-determined value of air pressure is reached.

9. The method of claim 2, wherein a first stratochamber is transparent and placed between the laser source and the substrate, a second stratochamber encloses the substrate, and the membrane seals up the first stratochamber and the second stratochamber; air is filled into the first stratochamber, and air in the second stratochamber is extracted, and the pressure that presses the membrane against the surface of the substrate is applied by air pressure difference between the first stratochamber and the second stratochamber.

10. The method of claim 9, wherein the air in the first stratochamber and the second stratochamber is adjusted by a control valve until a pre-determined value of air pressure is reached.

11. The method of claim 2, wherein a first stratochamber is transparent and placed between the laser source and the substrate, a second stratochamber encloses the substrate, and the membrane that seals up the second stratochamber is covered with a clamping film that seals up the first stratochamber; air is filled into the first stratochamber, and air in the second stratochamber is extracted; the membrane is pressed against the surface of the substrate by air filled in the first stratochamber and outside air.

12. The method of claim 11, wherein a pulling force is applied to the clamping film after the membrane is covered with the clamping film, and a value of the pulling force is adjusted based on the value of air pressure in the first stratochamber.

13. The method of claim 1, wherein the pressure is applied by a transparent clamping plate that presses the membrane against the surface of the substrate.

14. The method of claim 13, wherein a transparent elastic pad is arranged between the membrane and the clamping plate.

15. The method of claim 1 further comprising:
shielding, by a mask, non-welding area of the substrate to irradiate the welding area of the substrate through a transparent area of the mask.

16. A method to weld a membrane to a substrate of a microfluidic chip, the method comprising:
covering a surface of the substrate with the membrane;
applying, with a tensing apparatus, a pulling force on sides of the membrane to tense the membrane covering the surface of the substrate;
applying air pressure onto a surface of the membrane in order to press the membrane against the surface of the substrate;
adjusting a value of the pulling force of the tensing apparatus based on a value of the air pressure applied onto the surface of the membrane;
placing, over the membrane, a mask with a transparent area where a laser irradiates the membrane; and
irradiating, with the laser and through the transparent area, the membrane in order to fuse the membrane to the substrate of the microfluidic chip.

17. The method of claim 16, further comprising:
adjusting the value of the pulling force of the tensing apparatus based on elastic parameters of the membrane.

18. The method of claim 16, further comprising:
applying, with the tensing apparatus, the pulling force to the membrane to ensure that weld faces between the substrate and the membrane are flat and uniform.

19. The method of claim 16, further comprising:
adjusting the air pressure against the surface of the membrane to control deformation of the membrane.

\* \* \* \* \*